(12) United States Patent
Song et al.

(10) Patent No.: US 8,423,917 B2
(45) Date of Patent: Apr. 16, 2013

(54) MODELING THIN-FILM STACK TOPOGRAPHY EFFECT ON A PHOTOLITHOGRAPHY PROCESS

(75) Inventors: Hua Song, San Jose, CA (US); James P. Shiely, Aloha, OR (US); Qiaolin Zhang, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 249 days.

(21) Appl. No.: 12/512,677

(22) Filed: Jul. 30, 2009

(65) Prior Publication Data
US 2011/0029940 A1    Feb. 3, 2011

(51) Int. Cl.
*G06F 17/50* (2006.01)
(52) U.S. Cl.
USPC .............................................. 716/50; 716/51
(58) Field of Classification Search ............... 716/50–53
See application file for complete search history.

(56) References Cited

U.S. PATENT DOCUMENTS

| | | | |
|---|---|---|---|
| 6,338,922 B1 * | 1/2002 | Liebmann et al. | 430/5 |
| 7,003,755 B2 * | 2/2006 | Pang et al. | 716/52 |
| 7,093,229 B2 * | 8/2006 | Pang et al. | 716/52 |
| 7,266,800 B2 * | 9/2007 | Sezginer | 716/52 |
| 7,617,474 B2 * | 11/2009 | Pang et al. | 716/139 |
| 2004/0015808 A1 * | 1/2004 | Pang et al. | 716/19 |

* cited by examiner

*Primary Examiner* — Binh Tat
(74) *Attorney, Agent, or Firm* — Park, Vaughan, Fleming & Dowler, LLP; Fang Chen (57) ABSTRACT

One embodiment of the present invention provides a system that determines image intensity at a location in a photoresist (PR) layer on a wafer. During operation, the system receives a set of masks which were used to generate one or more patterned layers of a multilayer structure on the wafer, wherein a patterned layer includes a set of reflectors on a top surface of the patterned layer, which correspond to patterns in a patterned-layer mask in the set of masks, wherein a reflector reflects light from a light source during a photolithography process. The system then generates a first virtual mask based on the first mask and the patterned-layer mask, wherein the first virtual mask uses a clear area to model a reflector in the set of reflectors. Next, the system determines the image intensity value at the location on the PR layer based at least on the first mask and the first virtual mask.

23 Claims, 9 Drawing Sheets

PHOTOLITHOGRAPHY PROCESS 300

MODELING THIN-FILM STACK TOPOGRAPHY EFFECT ON A PHOTOLITHOGRAPHY PROCESS

BACKGROUND

1. Field

The present disclosure generally relates to techniques for designing and manufacturing integrated circuits (ICs). More specifically, the present disclosure relates to techniques and systems for accurately and efficiently modeling thin-film stack topography effect on a photolithography process.

2. Related Art

Dramatic improvements in semiconductor integration circuit (IC) technology presently make it possible to integrate hundreds of millions of transistors onto a single semiconductor IC chip. These improvements in integration densities have largely been achieved through corresponding improvements in semiconductor manufacturing technologies. Semiconductor manufacturing technologies typically include a number of processes which involve complex physical and chemical interactions. Since it is almost impossible to find exact formulae to predict the behavior of these complex interactions, developers typically use process models which are fit to empirical data to predict the behavior of these processes. A process model can be used in a number of applications during the design of a semiconductor chip.

For example, in a technique which is referred to as "optical proximity correction" (OPC), a photolithography process model (hereinafter "lithography model") is used to make corrections to a semiconductor chip layout to compensate for undesirable effects of semiconductor manufacturing processes. During an OPC process, an OPC simulation engine uses the lithography model to iteratively evaluate and modify edge segments in the mask layout. The post-OPC mask patterns are expected to produce physical patterns on the wafer that closely match design intent.

Note that the accuracy of the lithography model can limit both the effectiveness of corrected mask patterns and the correctness of post-OPC design layout verification. As Moore's law drives IC features to increasingly smaller dimensions (which are now below 45 nm), certain physical effects, which have been largely ignored or oversimplified in existing lithography models, are becoming increasingly important for lithography model accuracy. Hence, it is desirable to provide more comprehensive, physics-centric descriptions for these physical effects to improve the lithography model accuracy.

In particular, topography variation within a multilayer thin-film structure on a wafer is one of the physical effects that are inadequately represented in a conventional lithography model. During the semiconductor fabrication process, each patterned thin-film layer (or "patterned layer") is typically not planar but has topography variations caused by the pattern features within the thin-film layer. When a patterned layer is subsequently coated with photoresist in order to fabricate a new layer, the surface topography profile of the patterned layer becomes an "underlying" topography profile. Hence, in a multilayer thin-film stack, multiple underlying topography profiles, which typically differ from each other, exist at different depths underneath the wafer surface. Unfortunately, conventional lithography models can lead to serious defects caused by ignoring or oversimplifying the underlying topography effect. For example, it is noticed that when using such a conventional lithography model, pinching or breaking in implant layer resist lines can occur as a result of the topography effect from underlying shallow trench isolation (STI) layer and poly-gate layer.

Note that performing a rigorous lithography simulation of each underlying topography layer is often impractical because it can require days of computation time to compute the topography effect just for a very small wafer area. Hence, there is a need for efficient techniques and systems for accurately modeling the underlying thin-film topography effect on the lithography process without the above-described problems.

SUMMARY

One embodiment of the present invention provides a system that determines image intensity at a location in a photoresist (PR) layer on a wafer, wherein a photolithography process uses a light source and a first mask to expose the PR layer. The wafer includes a multilayer structure underneath the PR layer, wherein the multilayer structure includes one or more patterned layers which were created by one or more previous applications of the photolithography process. During operation, the system receives a set of masks which were used to generate the one or more patterned layers of the multilayer structure, wherein a patterned layer in the one or more patterned layers includes a set of reflectors on a top surface of the patterned layer, which correspond to patterns in a patterned-layer mask in the set of masks, wherein a reflector reflects light from the light source during the photolithography process. The system then generates a first virtual mask based at least on the first mask and the patterned-layer mask, wherein the first virtual mask uses a clear area to model a reflector in the set of reflectors. Next, the system determines the image intensity value at the location in the PR layer by: computing a first image intensity component due to the light source and the first virtual mask; and estimating the image intensity value by combining the first image intensity component with the image intensity component due to the light source and the first mask.

In some embodiments, the system determines if the patterned layer is the topmost layer in the multilayer structure. If so, the system generates the first virtual mask for the patterned layer by, for each pattern in the patterned layer, converting a corresponding pattern in the patterned-layer mask into a corresponding clear area in the first virtual mask.

In some embodiments, the corresponding clear area preserves some or all of the following properties of the corresponding pattern in the patterned-layer mask: a position of the corresponding pattern; a geometry of the corresponding pattern; a width of the corresponding pattern; a transmission coefficient of the corresponding pattern; and a phase of the corresponding pattern.

In some embodiments, the system converts the corresponding pattern into the corresponding clear area by biasing one or more of the following parameters of the corresponding pattern with a biasing factor: a position of the corresponding pattern; a geometry of the corresponding pattern; a width of the corresponding pattern; a transmission coefficient of the corresponding pattern; and a phase of the corresponding pattern.

In some embodiments, if the patterned layer is not the topmost layer in the multilayer structure, the system generates the first virtual mask for the patterned layer by first identifying overlapping regions between the patterned layer and each of the upper patterned layers in the multilayer structure which are above the patterned layer. Next, the system determines, for each pattern in the patterned layer, a corresponding reflector by subtracting the overlapping regions from the pattern. If the corresponding reflector has a non-zero area, the system then converts the corresponding reflector into a corresponding clear area in the first virtual mask.

In some embodiments, the corresponding clear area preserves some or all of the following properties of the corresponding reflector: a position of the corresponding reflector; a geometry of the corresponding reflector; a width of the corresponding reflector; a transmission coefficient of the corresponding reflector; and a phase of the corresponding reflector.

In some embodiments, the system identifies the overlapping regions between the patterned layer and each of the upper patterned layers by: first converting a corresponding mask for the upper patterned layer into a same mask tone as the corresponding mask for the patterned layer, and then performing an AND operation between the converted mask for the upper patterned layer and the corresponding mask for the patterned layer.

In some embodiments, the system converts the corresponding reflector into the corresponding clear area by biasing one or more of the following parameters of the corresponding reflector with a biasing factor: a geometry of the corresponding reflector; a width of the corresponding reflector; a transmission coefficient of the corresponding reflector; and a phase of the corresponding reflector.

In some embodiments, the system computes the first image intensity component due to the light source and the first virtual mask by: receiving a process model which models the photolithography process; adjusting the process model to take into account the position of the patterned layer; and convolving, at the location in the PR layer, the adjusted process model with the first virtual mask.

In some embodiments, the system adjusts the process model by adjusting an optical focus of the photolithography process based on the vertical position of the patterned layer.

In some embodiments, the system modifies the multilayer structure by planarizing the patterned layer.

In some embodiments, the system obtains the image intensity component by convolving, at the location in the PR layer, the process model with the first mask.

In some embodiments, the image intensity value is used during an optical proximity correction (OPC) process.

In some embodiments, the image intensity value is used for predicting a pattern's contour when the pattern is printed on the wafer.

In some embodiments, the system estimates the image intensity value by combining a first vector field component due to the light source and the first mask and a second vector field component due to the light source and the first virtual mask.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Integrated Circuit Design Flow

Figure 1:
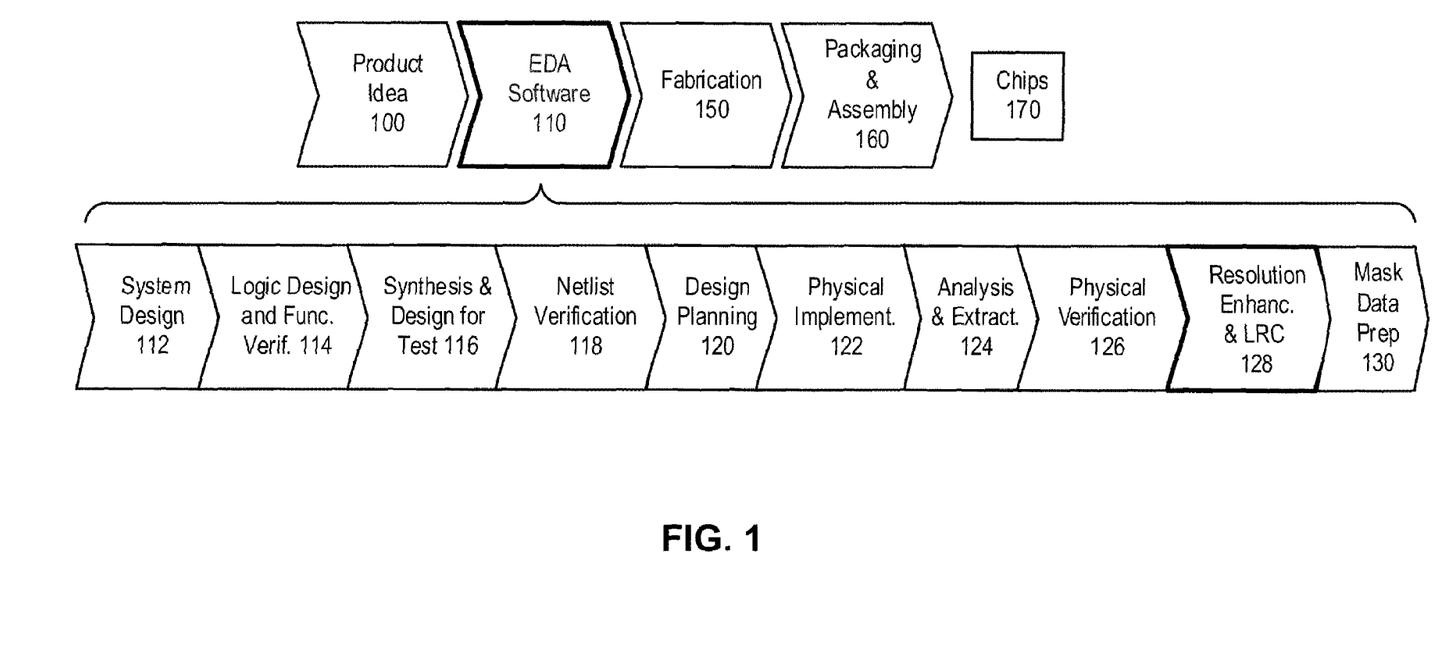
FIG. 1 illustrates various steps in the design and fabrication of an integrated circuit.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be passed on to the fabrication process which fabricates the design on the wafer (stage 150) and packaging and assembly processes (stage 160) are subsequently performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS, INC. that can be used at this stage include MODEL ARCHITECT®, SABER®, SYSTEM STUDIO®, and DESIGNWARE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS, INC. that can be used at this stage include VCS®, VERA®, DESIGNWARE®, MAGELLAN®, FORMALITY®, ESP® and LEDA® products.

Synthesis and design for test (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include DESIGN COMPILER®, PHYSICAL COMPILER®, TEST COMPILER®, POWER COMPILER®, FPGA COMPILER®, TETRAMAX®, and DESIGNWARE® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level; this, in turn, permits what-if refinement. Exemplary EDA software products from SYNOPSYS, INC. that can be used at this stage include ASTRORAIL®, PRIMERAIL®, PRIMETIME®, and STAR RC/XT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement and lithography rule checking (LRC) (stage 128): This stage involves geometric manipulations of the layout to improve manufacturability of the design and lithography printability checking. Exemplary EDA software products from SYNOPSYS, INC. that can be used at this stage include PROTEUS®, PROTEUS®AF, and SiVL® products.

Mask data preparation (stage 130): This stage provides the tape-out data for production of masks to produce finished chips. Exemplary EDA software products from SYNOPSYS, INC. that can be used at this stage include the CATS® family of products.

Embodiments of the present invention can be used during one or more of the above-described steps. Specifically, one embodiment of the present invention can be used during the resolution enhancement and lithography rule checking step 128.

Photolithography System

Figure 2:
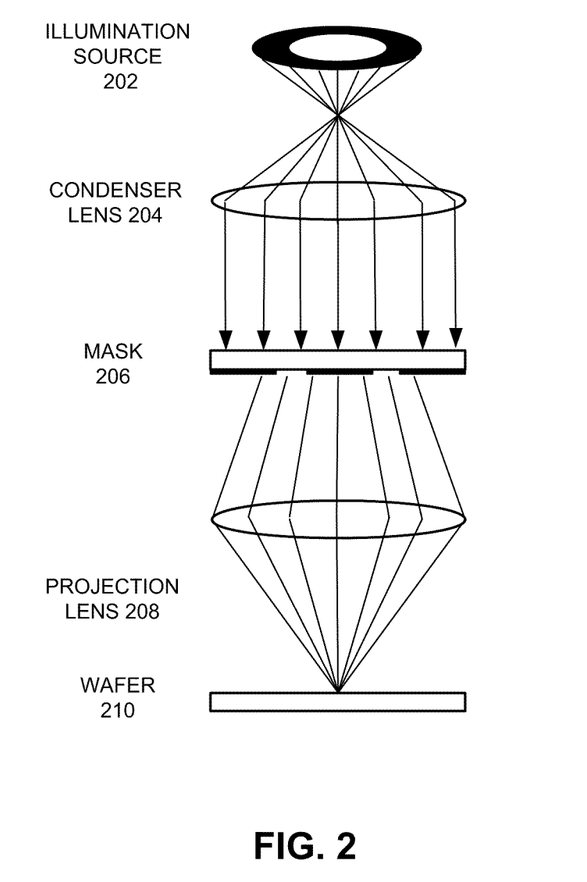
FIG. 2 illustrates a typical photolithography system in accordance with an embodiment of the present invention.

FIG. 2 illustrates a typical photolithography system in accordance with an embodiment of the present invention. As shown in FIG. 2, optical radiation emanates from an illumination source 202, which can include any suitable physical light source, such as a laser, and can include optical components for converting the light source into an illumination for photoresist exposure. This optical illumination passes through a condenser lens 204, and then through a mask 206. Mask 206 defines integrated circuit patterns to be printed (i.e., fabricated) onto a wafer 210.

The image of mask 206 passes through projection lens 208, which focuses the image onto wafer 210. Note that projection lens 208 can include a plurality of lenses configured to achieve a high-NA and other desirable optical properties. During operation, the above-described lithography system transfers circuitry defined by mask 206 onto wafer 210. Wafer 210 is a semiconductor wafer coated with a thin-film stack. This thin-film stack typically comprises a photoresist layer, or more generally, any layer to be exposed by the system. The thin-film stack typically also comprises one or more patterned thin-film layers (hereinafter "patterned layers") underneath the photoresist layer.

Modeling Underlying Topology Effect on Photolithography Process

A Single Underlying Patterned Layer

Figure 3A:
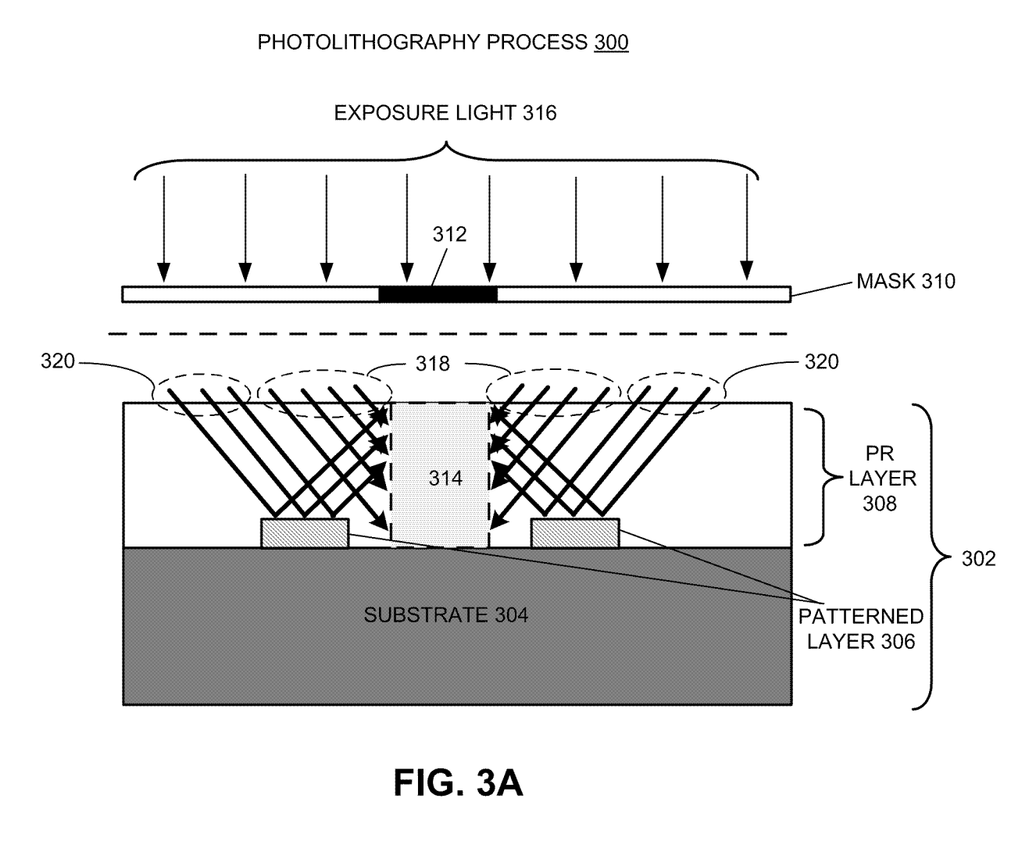
FIG. 3A illustrates an exemplary photolithography process which is affected by an underlying topology profile of a patterned layer on a wafer in accordance with an embodiment of the present invention.

FIG. 3A illustrates an exemplary photolithography process 300 which is affected by an underlying topology profile of a patterned layer on a wafer in accordance with an embodiment of the present invention. More specifically, photolithography process ("lithography process" hereinafter) 300 is performed on a simple wafer structure 302 which comprises a substrate 304 and a single patterned layer 306 on top of substrate 304. Note that patterned layer 306 was previously fabricated through a separate lithography process by using a photomask (or "mask") which defines patterns in patterned layer 306.

Patterned layer 306 and the wafer surface are covered with a photoresist (PR) layer 308. During lithography process 300, a mask 310, which is also referred to a "current mask" or a "main mask" in the following discussion, is used to print patterns in PR layer 308. In the embodiment of FIG. 3A, mask 310 is a bright-field mask having an opaque region 312 which is expected to define a ridgeline structure 314 (i.e., the dash-lined image in PR layer 308) after exposing and developing PR layer 308. However, the present techniques can also be applied to dark-field masks. Note that patterned layer 306 can be any thin-film layer commonly used within an IC chip, for example, a poly-silicon layer, an active layer, a metal layer, or an oxide layer. Note also that the relative sizes of mask 310 and wafer 302 and their spatial relationship are simplified for the convenience of describing the exposure process below.

During lithography process 300, an incoming exposure light 316 passes through the clear areas in mask 310 and exposes PR layer 308 to define ridgeline structure 314. As illustrated in FIG. 3A, exposure light 316 entering PR layer 308 can be divided into two parts: the first part which passes through PR layer 308 and reflects off the surface of patterned layer 306; and the second part which does not reflect off patterned layer 306. Based on this classification, the exposure depicted in FIG. 3A can be viewed as a sum of two exposures: a first exposure 318 which only involves light which does not reflect off patterned layer 306, referred to as a "topo-effect-free" exposure; and a second exposure 320 which involves light which reflects off the top surface of patterned layer 306, referred to as a "topo-induced" exposure. In the following discussion, we refer to each pattern in patterned layer 306 that reflects incoming light as a "reflector." Hence, each underlying patterned layer can include one or multiple reflectors, each of which corresponds to a pattern in a mask which was used to generate the patterned layer. Note that because the topo-induced exposure due to these reflectors depends on the topography profile of patterned layer 306, it is typically difficult to model the second exposure without doing rigorous topography simulation on the patterned layer 306.

Figure 3B:
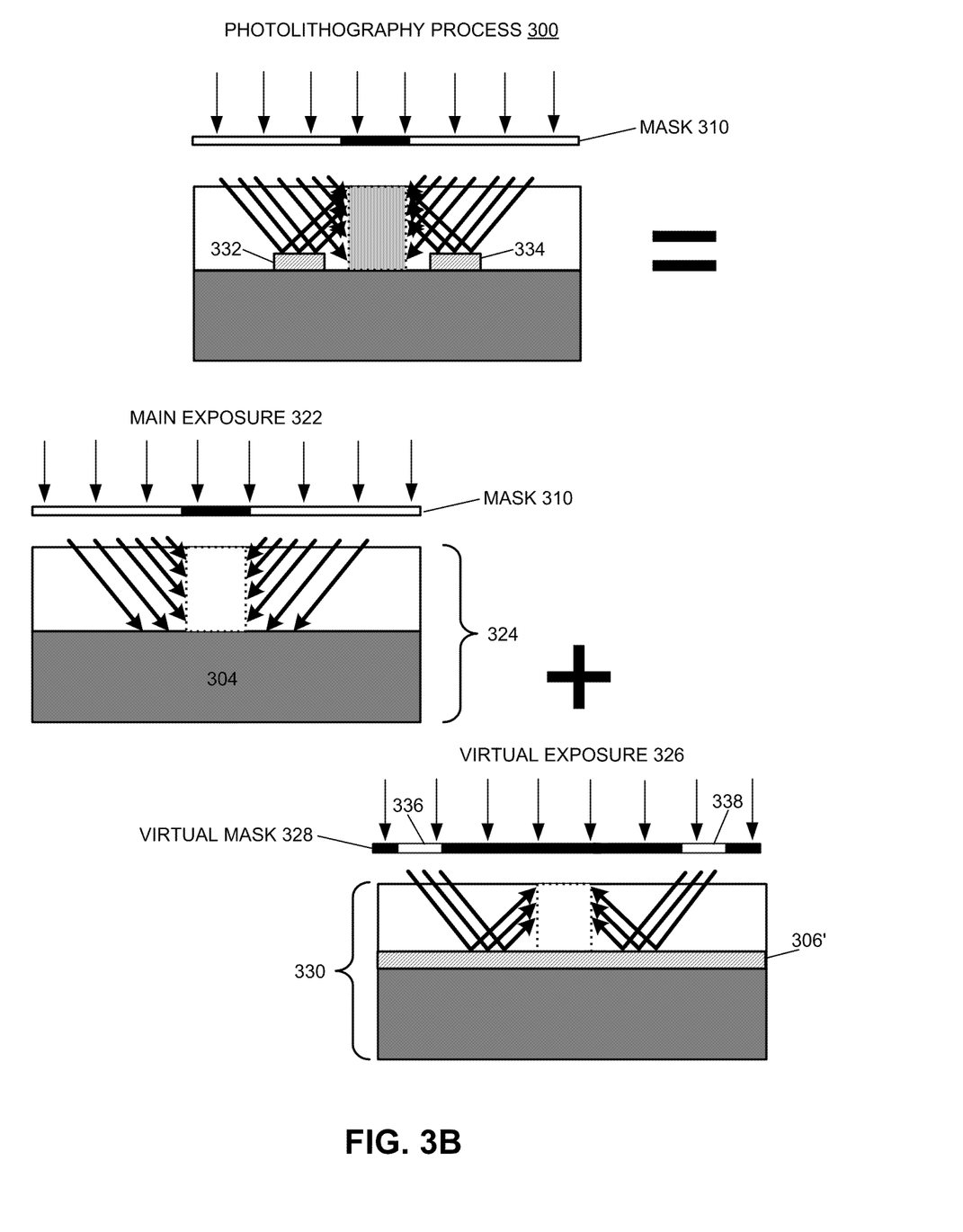
FIG. 3B illustrates a process of modeling the lithography process in FIG. 3A as two separate exposures using two masks in accordance with an embodiment of the present invention.

In one embodiment of the present invention, the topo-induced exposure can be modeled without doing a rigorous topography simulation. More specifically, the topo-induced exposure may be modeled as an extra "virtual" exposure with a "virtual" topography mask, which is then separated from the topo-effect-free exposure. FIG. 3B illustrates a process of modeling lithography process 300 in FIG. 3A as two separate exposures using two masks in accordance with an embodiment of the present invention.

As illustrated in FIG. 3B, the topo-effect-free exposure by exposure light 318 in FIG. 3A is modeled as a separate main exposure 322 based on the current mask 310 in FIG. 3A over a wafer structure 324. In one embodiment, wafer structure 324 is obtained by removing patterned layer 306 from wafer structure 302. Note that when patterned layer 306 is removed, the modeling is performed on a planar surface of substrate 304.

Separately, topo-induced exposure by exposure light 320 is modeled as a "virtual" exposure 326 based on a virtual mask 328. As indicated in FIG. 3B, each clear area in virtual mask 328 causes an exposure which corresponds to a portion of the light reflected off a pattern in patterned layer 306. However, because the topo-induced exposure is effectively converted into a separate exposure through virtual mask 328, patterned layer 306 can be planarized. Hence, virtual exposure 326 is performed on a wafer structure 330, which is obtained by planarizing patterned layer 306 in wafer structure 302 as layer 306' in wafer structure 330. Consequently, lithography process 300 can be computed based on both the main mask and the virtual mask using conventional modeling techniques without doing rigorous topography simulation. This technique facilitates accurately modeling the reflections on the patterned layer without sacrificing simulation speed. We now describe how virtual mask 328 is generated in some embodiments.

Figure 4:
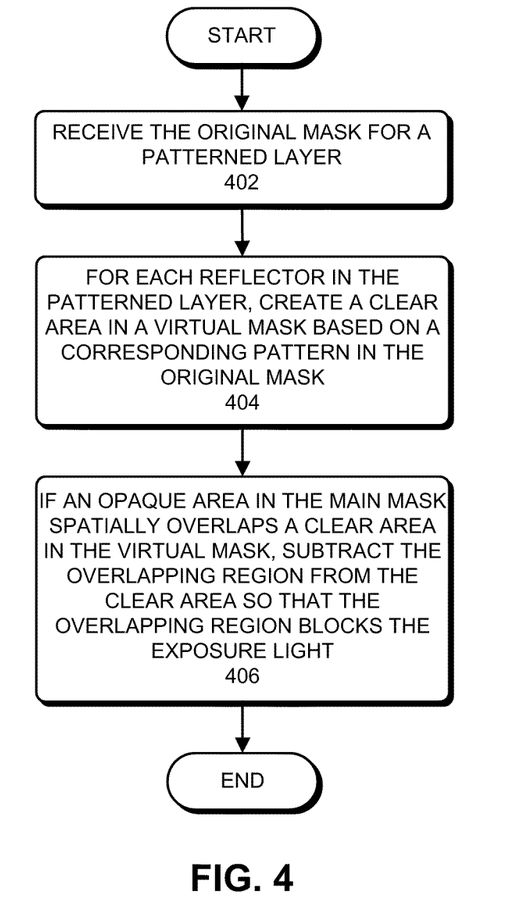
FIG. 4 presents a flowchart illustrating a process for generating a virtual mask in accordance with an embodiment of the present invention.

FIG. 4 presents a flowchart illustrating a process for generating a virtual mask in accordance with an embodiment of the present invention. In this embodiment, virtual mask 328 is generated based partially on the mask which was used to create patterned layer 306, referred to as the "original mask" hereafter. More specifically, the system first receives the original mask, which can be either a bright-field mask or a dark-field mask (step 402). Next, for each reflector in the patterned layer 306, the system creates a clear area in virtual mask 328 based on a corresponding pattern in the original mask (step 404). We also refer to each clear area as a pattern in virtual mask 328. For example, patterned layer 306 contains two reflectors 332 and 334. Hence, for each of the two reflectors, the system converts a corresponding pattern in the original mask into a corresponding clear area (i.e., 336 and 338) in virtual mask 328. In this embodiment, a virtual mask is generated to let light pass through the patterns to mimic the reflections from the topography features in the pattern layer. Note that a virtual mask generated in this manner typically has a fixed tone. Consequently, depending on how the patterned layer was generated, the tone of the virtual mask may be different from the associated original mask even if the mask patterns in the virtual mask and the original mask happen to be the same.

In some embodiments, the system creates a pattern in the virtual mask which preserves some or all of the properties of the corresponding pattern in the original mask. Such properties can include, but are not limited to, a position of the corresponding pattern, a geometry of the corresponding pattern, a width of the corresponding pattern, a transmission coefficient of the corresponding pattern, and a phase of the corresponding pattern. In other embodiments, a pattern in the virtual mask is obtained by biasing one or more of the above parameters of the corresponding pattern in the original mask with a biasing factor. As is described in more detail below, these biasing factors may be regressed with other regression parameters during the model calibration process based on experimental data.

Referring to FIG. 3A, note that opaque area 312 in mask 310 can block some exposure light 316 from reaching patterned layer 306, and thus modifies the illumination profile on patterned layer 306. In some embodiments, the blocking effect from the main mask may be subtracted from the virtual mask. More specifically, if an opaque area in the main mask spatially overlaps a clear area in the virtual mask, the system subtracts the overlapping region from the clear area so that the overlapping region blocks the exposure light (step 406). This generates a virtual mask which includes the blocking effect from the main mask.

Upon generating the virtual mask, the two exposures based on both the original mask and the virtual mask can be combined to predict image intensity for the lithography process depicted in FIG. 3. We now describe an embodiment of computing a combined image intensity of the two exposures.

Figure 5:
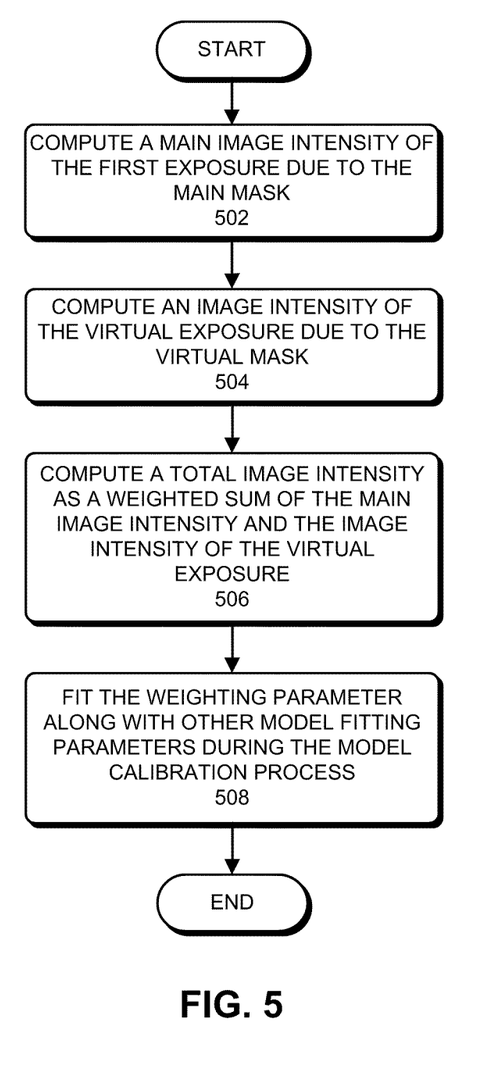
FIG. 5 presents a flowchart illustrating a process of computing a combined image intensity of the two exposures due to both the main mask and the virtual mask in accordance with an embodiment of the present invention.

FIG. 5 presents a flowchart illustrating a process of computing a combined image intensity of the two exposures due to both the main mask and the virtual mask in accordance with an embodiment of the present invention.

During operation, the system first computes the main image intensity of the first exposure due to the main mask ($M_0$), which involves convolving $M_0$ with a lithography model $K_0$ which describes the lithography system including wafer structure 324 (step 502). In the embodiment of FIG. 3B, $K_0$ is different from a lithography model for the original system of FIG. 3A in that $K_0$ does not include patterned layer 306. In one embodiment, $K_0$ is represented by a set of model kernels in transmission cross-coefficient (TCC) form. Also note that this exposure may be evaluated using the original optical focus on PR layer 308, referred to as $f_0$. Hence, the main optical image intensity $I_0$ due to the original mask is expressed as:

$$I_0 = M_0 \otimes K_0(f_0), \quad (1)$$

wherein "$\otimes$" represents the convolution operation, and $K_0(f_0)$ indicates that the convolution is evaluated at the original optical focus. Note that $K_0$ describes a wafer structure without the patterned layer. In one embodiment, the main image intensity $I_0$ is computed based on a Hopkins imaging formulation.

Next, the system computes the image intensity of the virtual exposure due to the virtual mask ($M_1$), which involves convolving $M_1$ with a lithography model $K_1$ which describes the lithography system including a modified wafer structure 330 (step 504). In the embodiment of FIG. 3B, $K_1$ is different from a lithography model for the original system of FIG. 3A in that the topography effect is removed from the wafer structure by planarizing the patterned layer 306. In one embodiment, $K_1$ is also represented by a set of model kernels in TCC form. In one embodiment, the optical focus for the virtual exposure is on patterned layer 306, referred to as $f_1$, which is typically different from the main focus $f_0$. Such difference is typically dependent on the vertical position of the planar layer 306'. Hence, the virtual image intensity $I_1$ due to the virtual mask $M_1$ is expressed as:

$$I_1 = M_1 \otimes K_1(f_1), \quad (2)$$

wherein $K_1(f_1)$ indicates that the convolution is evaluated at the topography-dependent optical focus $f_1$. Note that both optical foci $f_0$ and $f_1$ may be calibrated with other modeling parameters during the model calibration process by fitting the model to experimental data. In one embodiment, the virtual image intensity $I_1$ is computed based on a Hopkins imaging formulation.

The system next computes image intensity for the original lithography process 300 by combining both of the image intensities (step 506). In one embodiment, the final image intensity $I_{tot}$ may be computed as a weighted sum of the main image intensity $I_0$ and the topo-induced image intensity $I_1$, such that:

$$I_{tot} = (I_0 + r \times I_1)/(1+r), \quad (3)$$

wherein r is a weighting parameter. Next, during the model calibration process, the system fits the weighting parameter along with other model fitting parameters (step 508). Finally, the image intensity $I_{tot}$ can be evaluated at any coordinate location (x, y) in the wafer to obtain optical intensity values $I_{tot}(x, y)$:

$$I_{tot}(x,y) = (I_0(x,y) + r \times I_1(x,y))/(1+r). \quad (4)$$

Note that the image intensity values $I_{tot}(x, y)$ can then be used during an optical proximity correction (OPC) process for predicting a pattern's contour when the pattern is printed on wafer 302.

In a further embodiment, the final image intensity $I_{tot}$ may be computed based on the vector field $\overline{E}_0$ associated with the main image intensity $I_0$ and the vector field $\overline{E}_1$ associated with the topo-induced image intensity $I_1$, such that:

$$I_{tot} = |\overline{E}_0 + \overline{E}_1|^2, \quad (5)$$

wherein $|\overline{E}_0|^2 = I_0$ and $|\overline{E}_1|^2 = I_1$. Hence, $$I_{tot} = |\overline{E}_0|^2 + |\overline{E}_1|^2 + 2<\overline{E}_0, \overline{E}_1> = I_0 + I_1 + 2<\overline{E}_0, \overline{E}_1>, \quad (6)$$

Note that the cross term $2<\overline{E}_0, \overline{E}_1>$ in Eqn. (6) represents the interaction between the two vector fields $\overline{E}_0$ and $\overline{E}_1$, which can be tricky to compute using intensity-based lithography models. If the cross term is ignored, one obtains an approximation for the final image intensity:

$$I_{tot} = I_0 + I_1. \quad (7)$$

Note that Eqn. (3) above can be viewed as a modified Eqn. (7) by providing weights to the two image intensity terms in Eqn. (7).

Multiple Underlying Patterned Layers

Figure 6A:
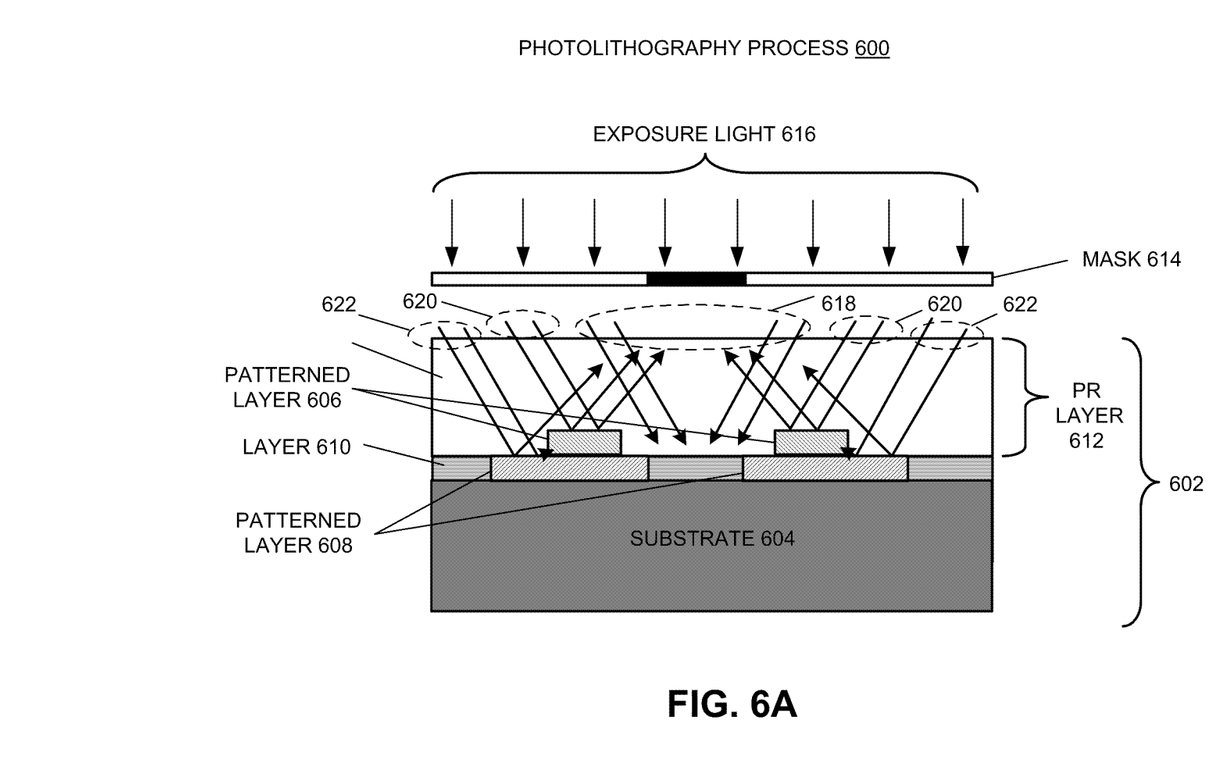
FIG. 6A illustrates an exemplary photolithography process which is affected by two underlying patterned layers on a wafer in accordance with an embodiment of the present invention.

While FIGS. 3A and 3B illustrate wafer 302 as comprising only one patterned layer 306, a typical thin-film stack on a wafer can have multiple previously fabricated patterned layers. FIG. 6A illustrates an exemplary lithography process 600 which is affected by two underlying patterned layers on a wafer in accordance with an embodiment of the present invention.

More specifically, lithography process 600 is performed on a wafer structure 602 which comprises a substrate 604 and two patterned layers 606 and 608 on top of substrate 604. Note that the lower patterned layer 608 was previously fabricated through a lithography process by using a first mask which defines patterns in patterned layer 608, and the upper patterned layer 606 was fabricated through a subsequent lithography process by using a second mask which defines patterns in patterned layer 606. In the embodiment of FIG. 6A, the lower patterned layer 608 is planarized by an oxide layer 610.

The upper patterned layer 606 and the wafer surface are covered with a PR layer 612. During lithography process 600, a mask 614, which is substantially the same as mask 310 in FIG. 3A, is used to print images in PR layer 612. Note that patterned layers 606 and 608 can be any layers commonly used in IC fabrication. In one embodiment, the upper patterned layer 606 is a poly-gate layer while the lower patterned layer 608 is an active layer. Note that the relative sizes of mask 614 and wafer 602 and their spatial relationship are simplified for the convenience of describing the exposure process below.

During lithography process 600, an exposure light 616 passes through the clear areas in mask 614 and exposes PR layer 612. As illustrated in FIG. 6A, exposure light 616 entering PR layer 612 can be divided into three parts: the first part which passes through PR layer 612 and reflects off the top surface of patterned layer 606, the second part which passes through PR layer 612 and reflects off the top surface of patterned layer 608, and the third part which does not reflect off either of the patterned layers. Based on this classification, the exposure depicted in FIG. 6A can be viewed as a sum of three exposures: a topo-effect-free exposure 618 similar to exposure 318 in FIG. 3A; a first topo-induced exposure 620 due to the reflection off the top surface of the upper patterned layer 606; and a second topo-induced exposure 622 due to reflection off the top surface of the lower patterned layer 608. Note, however, that some of the reflected light 622 is blocked by the upper patterned layer 606 due to the spatial overlap between the two patterned layers. The blocked portion of the reflected light 622 does not contribute to the exposure of PR layer 612. This blocking effect is further considered below.

Figure 6B:
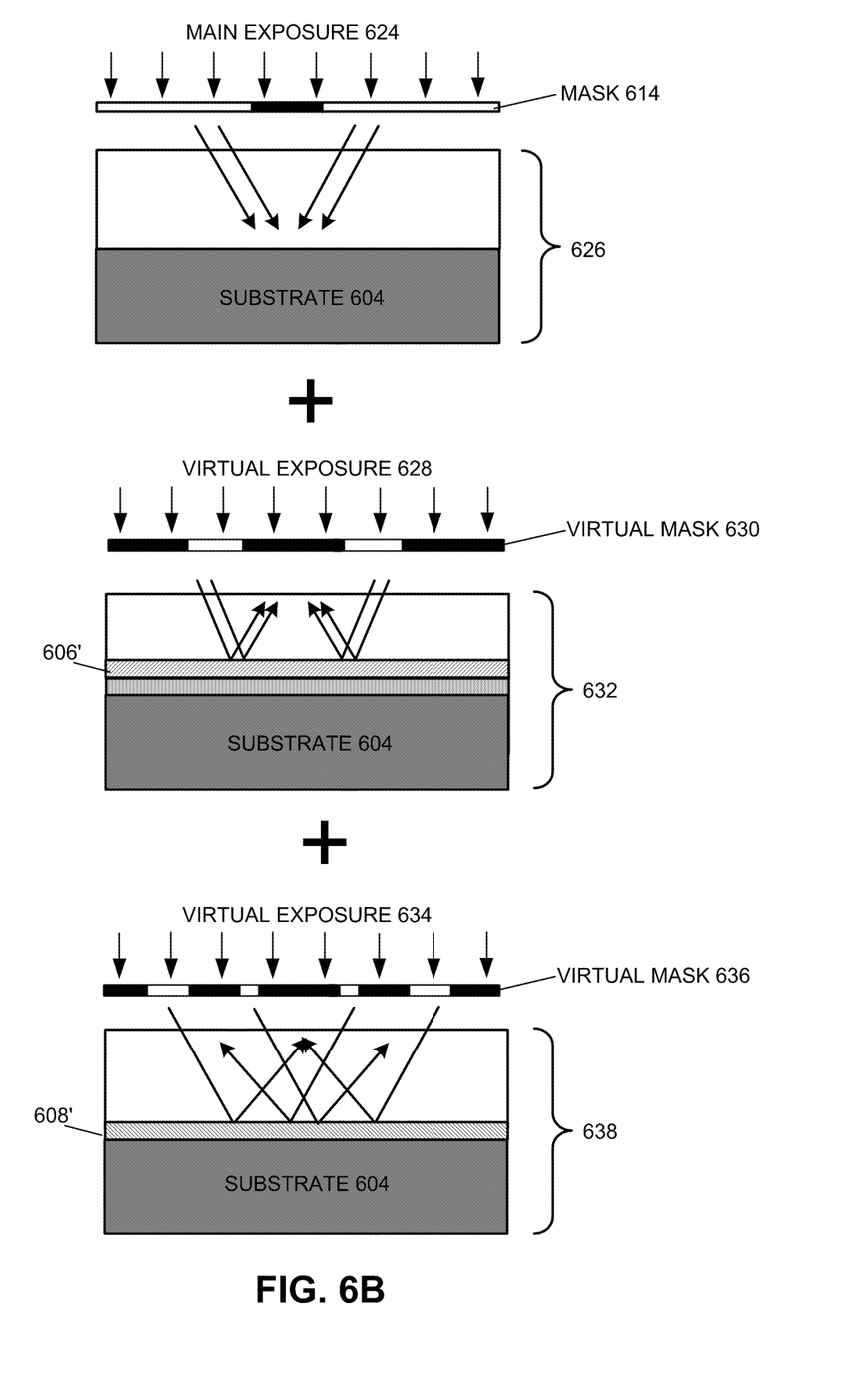
FIG. 6B illustrates a process of modeling the lithography process in FIG. 6A as three separate exposures using three masks in accordance with an embodiment of the present invention.

In the same manner as the virtual exposure was introduced in FIG. 3B, the two topo-induced exposures may be modeled as extra virtual exposures with corresponding virtual topography masks, and subsequently separated from the topo-effect-free exposure. FIG. 6B illustrates a process of modeling the lithography process in FIG. 6A as three separate exposures using three masks in accordance with an embodiment of the present invention.

As illustrated in FIG. 6B, the topo-effect-free exposure by exposure light 618 in FIG. 6A is modeled as a separate main exposure 624 based on the main mask 614 in FIG. 6A through a wafer structure 626 without the presence of the patterned layers 606 and 608. Note that when the patterned layers are removed, the modeling is performed on a planar surface of substrate 604.

Separately, the first topo-induced exposure by exposure light 620 is modeled as a first virtual exposure 628 based on a first virtual mask 630. As indicated in FIG. 6B, each clear area in virtual mask 630 causes an exposure which corresponds to a portion of the light reflected off a pattern in patterned layer 606. Furthermore, because the reflection off patterned layer 606 is effectively converted into a separate exposure through virtual mask 630, patterned layer 606 can be planarized. Hence, virtual exposure 628 is performed on a wafer structure 632, which is obtained by planarizing patterned layer 606 in wafer structure 602 as layer 606' in wafer structure 632. Note that virtual mask 630 may be generated using the technique described in conjunction with FIG. 4.

Additionally, the second topo-induced exposure by exposure light 622 is modeled as a second virtual exposure 634 based on a second virtual mask 636. As indicated in FIG. 6B, each clear area in virtual mask 636 causes an exposure which corresponds to a portion of the topo-induced exposure not included in exposures 624 and 628. Because patterned layer 606 has been considered in virtual exposure 628, patterned layer 606 is removed from the thin-film stack. Furthermore, because the reflection off patterned layer 608 is effectively converted into a separate exposure through virtual mask 636, patterned layer 608 can be planarized. Hence, virtual exposure 634 is performed on a wafer structure 638, which is obtained by removing patterned layer 606 and planarizing patterned layer 608 as layer 608' in wafer structure 638.

Thus, the topo-induced exposures can be computed based on the associated virtual masks and virtual exposures using conventional modeling techniques without performing rigorous topography simulation. This technique facilitates accurately modeling the reflections on the patterned layer without sacrificing simulation speed.

As mentioned above, the light-blocking effect due to the overlapping between the first and second patterned layers should be taken into account when generating the second virtual mask 636. In one embodiment, second virtual mask 636 is generated by first obtaining an intermediate virtual mask without considering the blocking effect from upper patterned layer 606. Note that this intermediate virtual mask can be obtained by applying all above-described techniques for generating virtual mask 328. Next, second virtual mask 636 is obtained by subtracting the clear areas in first virtual mask 630 from the clear areas in the intermediate virtual mask. This operation effectively removes the overlapping regions from the clear areas in the intermediate virtual mask. In a further embodiment, second virtual mask 636 is further corrected by subtracting opaque areas in the main mask 614 if these opaque areas overlap with the clear areas in second virtual mask 636.

Upon generating the two virtual masks 630 and 636, the multiple exposures based on both the main mask and the virtual masks can be combined to predict the image intensity for lithography process 600 depicted in FIG. 6A.

In one embodiment, the system first computes the main image intensity of the main exposure due to the main mask ($M_0$), which involves convolving $M_0$ with a lithography model $K_0$ which describes the lithography system including the wafer structure 626. Hence, the main image intensity $I_0$ due to the main mask is expressed as:

$$I_0 = M_0 \otimes K_0(f_0),$$

wherein $\otimes$ represents the convolution operation, and $K_0(f_0)$ indicates that the convolution is evaluated at the original optical focus. In one embodiment, the above main image intensity $I_0$ is computed based on a Hopkins imaging formulation.

Next, the system computes the image intensity of the first virtual exposure due to the first virtual mask ($M_1$), which involves convolving $M_1$ with a modified lithography model $K_1$ which describes the lithography system including a modified wafer structure 632. In the embodiment of FIG. 6B, $K_1$ is different from the lithography model for the original system in that the first topo-induced effect is removed from the wafer structure by planarizing the patterned layer 606. Hence, the first virtual image intensity $I_1$ due to the first virtual mask is expressed as:

$$I_1 = M_1 \otimes K_1(f_1),$$

wherein $K_1(f_1)$ indicates that the convolution is evaluated at the topography-dependent optical focus $f_1$ on the first patterned layer. In one embodiment, the first virtual image intensity $I_1$ is computed based on a Hopkins imaging formulation.

The system then computes the image intensity of the second virtual exposure due to the second virtual mask ($M_2$), which involves convolving $M_2$ with a modified lithography model $K_2$ which describes the lithography system including a modified wafer structure 638. In the embodiment of FIG. 6B, $K_2$ is different from the lithography model for the original system in that both the first and the second topo-induced effects are removed from the wafer structure by removing patterned layer 606 and planarizing patterned layer 608. Hence, the second virtual image intensity $I_2$ due to the second virtual mask is expressed as:

$$I_2 = M_2 \otimes K_2(f_2),$$

wherein $K_2(f_2)$ indicates that the convolution is evaluated at the topography-dependent optical focus $f_2$ on the second patterned layer. In one embodiment, the second virtual image intensity $I_2$ is computed based on a Hopkins imaging formulation. Note that all of the above optical foci $f_0$, $f_1$ and $f_2$ may be calibrated with other modeling parameters during the model calibration process using experimental data.

The system next computes image intensity for the original lithography process 600 by combining all three image intensities. In one embodiment, the final image intensity $I_{tot}$ may be computed as a weighted sum of the main image intensity $I_0$ and the two topo-induced image intensities $I_1$ and $I_2$, such that:

$$I_{tot} = (I_0 + r_1 \times I_1 + r_2 \times I_2)/(1 + r_1 + r_2), \quad (8)$$

wherein $r_1$, $r_2$ are weights as well as fitting parameters which are determined during the subsequent modeling calibration processes. Finally, the image intensity $I_{tot}$ can be evaluated at any coordinate location (x, y) in the wafer to obtain optical intensity values $I_{tot}(x, y)$:

$$I_{tot}(x,y) = (I_0(x,y) + r_1 \times I_1(x,y) + r_2 \times I_2(x,y))/(1 + r_1 + r_2). \quad (9)$$

Note that the image intensity values $I_{tot}(x, y)$ can then be used during an optical proximity correction (OPC) process for predicting a pattern's contour when the pattern is printed on wafer 602.

In a further embodiment, the final image intensity $I_{tot}$ may be computed based on the vector fields $\overline{E}_0$, $\overline{E}_1$ and $\overline{E}_2$ associated with the main image intensity $I_0$ and the two topo-induced image intensities $I_1$ and $I_2$, respectively, such that:

$$I_{tot} = |\overline{E}_0 + \overline{E}_1 + \overline{E}_2|^2, \quad (10)$$

wherein $|\overline{E}_0|^2 = I_0$, $|\overline{E}_1|^2 = I_1$ and $|\overline{E}_2|^2 = I_2$.

Similarly, if the cross terms in the expanded Eqn. (10) are ignored, one obtains an approximation for the final image intensity:

$$I_{tot} = I_0 + I_1 + I_2 \quad (11)$$

Note that Eqn. (8) above can be viewed as a modified Eqn. (11) by providing weights to the three image intensity terms in Eqn. (8).

Figure 7:
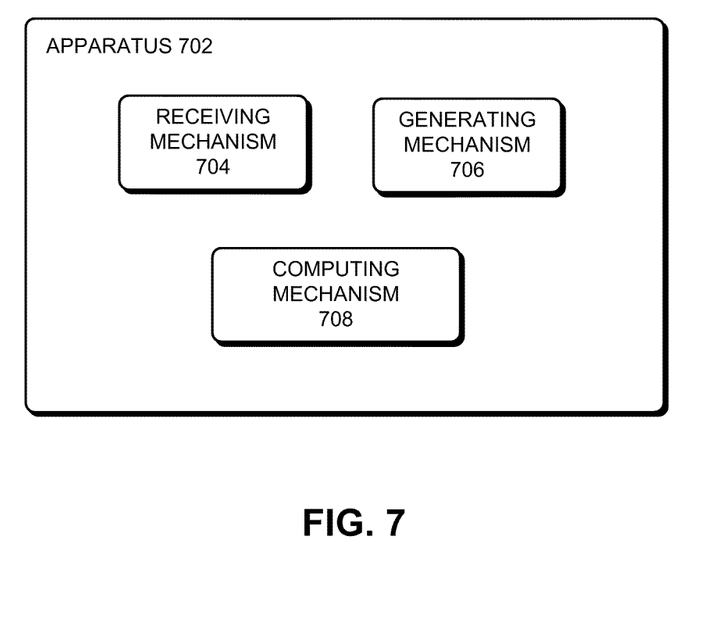
FIG. 7 illustrates an apparatus that determines image intensity at a location in a PR layer on a wafer during a photolithography process in accordance with an embodiment of the present invention.

FIG. 7 illustrates an apparatus that determines image intensity at a location in a PR layer on a wafer during a photolithography process which uses a light source and a first mask to expose the PR layer. The wafer includes a multilayer structure underneath the PR layer, wherein the multilayer structure includes one or more patterned layers which were created by one or more previous applications of the photolithography process.

Apparatus 702 can comprise mechanisms which communicate with one another via a wired or wireless communication channel. Specifically, apparatus 702 can comprise a receiving mechanism 704, a generating mechanism 706, and a computing mechanism 708. Each of the above mechanisms may be realized using one or more integrated circuits or as a module of a general purpose processor. Apparatus 702 can be part of a computer system.

In some embodiments, receiving mechanism 704 may be configured to receive a set of masks which were used to generate the one or more patterned layers of the multilayer structure, wherein a patterned layer includes a set of reflectors on a top surface of the patterned layer, which correspond to patterns in a patterned-layer mask in the set of masks, wherein a reflector reflects light from the light source during the photolithography process; generating mechanism 706 may be configured to generate a first virtual mask based at least on the first mask and the patterned-layer mask, wherein the first virtual mask uses a clear area to model a reflector in the set of reflectors; and computing mechanism 708 may be configured to compute a first image intensity component due to the light source and the first virtual mask and subsequently estimate the image intensity value by combining the first image intensity component with the image intensity component due to the light source and the first mask.

CONCLUSION

Embodiments of this disclosure provide techniques for modeling thin-film topography-dependent reflection and its effect on optical imaging during a lithography process by using extra virtual exposures associated with virtual topography masks. These techniques can be used to model any wafer topography effect for OPC applications. While the techniques are described in the context of lithography systems having one and two underlying topography layers, these techniques can be easily extended to process more general thin-film stacks having any number of reflective topography layers. Furthermore, while the techniques are described using two-dimensional (2D) cross-sectional views of the lithography system, these techniques are meant to be used in general three-dimensional (3D) lithography systems.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining image intensity at a location in a photoresist (PR) layer on a wafer, wherein a photolithography process uses a light source and a first mask to expose the PR layer, wherein the wafer includes a multilayer structure underneath the PR layer, and wherein the multilayer structure includes one or more patterned layers which were created by one or more previous applications of the photolithography process, the method comprising:
   receiving a set of masks which were used to generate the one or more patterned layers of the multilayer structure, wherein a patterned layer in the one or more patterned layers includes a set of reflectors on a top surface of the patterned layer, which correspond to patterns in a patterned-layer mask in the set of masks, wherein a reflector reflects light from the light source during the photolithography process;
   generating, by computer, a first virtual mask based at least on the first mask and the patterned-layer mask, wherein the first virtual mask uses a clear area to model a reflector in the set of reflectors of the patterned layer on the wafer; and
   determining the image intensity value at the location in the PR layer by:
      computing a first image intensity component due to the light source and the first virtual mask, which involves:
         receiving a process model which models the photolithography process;
         adjusting the process model to take into account the position of the patterned layer;
         and convolving, at the location in the PR layer, the adjusted process model with the first virtual mask; and
      estimating the image intensity value by combining the first image intensity component with an image intensity component due to the light source and the first mask.

2. The method of claim 1, wherein if the patterned layer is the topmost layer in the multilayer structure, generating the first virtual mask for the patterned layer involves:
   for each pattern in the patterned layer, converting a corresponding pattern in the patterned-layer mask into a corresponding clear area in the first virtual mask, wherein the corresponding clear area preserves some or all of the following properties of the corresponding pattern in the patterned-layer mask:
   a position of the corresponding pattern;
   a geometry of the corresponding pattern;
   a width of the corresponding pattern;
   a transmission coefficient of the corresponding pattern; and
   a phase of the corresponding pattern.

3. The method of claim 2, wherein converting the corresponding pattern into the corresponding clear area involves biasing one or more of the following parameters of the corresponding pattern with a biasing factor to obtain the corresponding clear area:
   a position of the corresponding pattern;
   a geometry of the corresponding pattern;
   a width of the corresponding pattern;
   a transmission coefficient of the corresponding pattern; and
   a phase of the corresponding pattern.

4. The method of claim 1, wherein if the patterned layer is not the topmost layer in the multilayer structure, generating the first virtual mask for the patterned layer involves:
   identifying overlapping regions between the patterned layer and each of the upper patterned layers in the multilayer structure which are above the patterned layer;
   for each pattern in the patterned layer,
      determining a corresponding reflector by subtracting the overlapping regions from the pattern; and
      if the corresponding reflector has a non-zero area, converting the corresponding reflector into a corresponding clear area in the first virtual mask;
   wherein the corresponding clear area preserves some or all of the following properties of the corresponding reflector:
   a position of the corresponding reflector;
   a geometry of the corresponding reflector;
   a width of the corresponding reflector;
   a transmission coefficient of the corresponding reflector; and
   a phase of the corresponding reflector.

5. The method of claim 4, wherein identifying the overlapping regions between the patterned layer and each of the upper patterned layers involves:
   converting a corresponding mask for the upper patterned layer into a same mask tone as the corresponding mask for the patterned layer; and
   performing an AND operation between the converted mask for the upper patterned layer and the corresponding mask for the patterned layer.

6. The method of claim 4, wherein converting the corresponding reflector into the corresponding clear area involves biasing one or more of the following parameters of the corresponding reflector with a biasing factor to obtain the corresponding clear area:
- a position of the corresponding reflector;
- a geometry of the corresponding reflector;
- a width of the corresponding reflector;
- a transmission coefficient of the corresponding reflector; and
- a phase of the corresponding reflector.

7. The method of claim 1, wherein adjusting the process model involves adjusting an optical focus of the photolithography process based on the vertical position of the patterned layer.

8. The method of claim 1, wherein adjusting the process model involves modifying the multilayer structure by planarizing the patterned layer.

9. The method of claim 1, wherein the method further comprises obtaining the image intensity component by convolving, at the location in the PR layer, the process model with the first mask.

10. The method of claim 1, wherein the image intensity value is used during an optical proximity correction (OPC) process.

11. The method of claim 1, wherein the image intensity value is used for predicting a pattern's contour when the pattern is printed on the wafer.

12. The method of claim 1, wherein estimating the image intensity value involves combining a first vector field component due to the light source and the first mask and a second vector field component due to the light source and the first virtual mask.

13. A non-transitory computer-readable storage medium storing instructions that when executed by a computer cause the computer to perform a method for determining image intensity at a location in a photoresist (PR) layer on a wafer, wherein a photolithography process uses a light source and a first mask to expose the PR layer, wherein the wafer includes a multilayer structure underneath the PR layer, and wherein the multilayer structure includes one or more patterned layers which were created by one or more previous applications of the photolithography process, the method comprising:
  receiving a set of masks which were used to generate the one or more patterned layers of the multilayer structure, wherein a patterned layer in the one or more patterned layers includes a set of reflectors on a top surface of the patterned layer, which correspond to patterns in a patterned-layer mask in the set of masks, wherein a reflector reflects light from the light source during the photolithography process;
  generating a first virtual mask based at least on the first mask and the patterned-layer mask, wherein the first virtual mask uses a clear area to model a reflector in the set of reflectors of the patterned layer on the wafer; and
  determining the image intensity value at the location in the PR layer by:
    computing a first image intensity component due to the light source and the first virtual mask, which involves:
      receiving a process model which models the photolithography process;
      adjusting the process model to take into account the position of the patterned layer;
      and convolving, at the location in the PR layer, the adjusted process model with the first virtual mask; and
    estimating the image intensity value by combining the first image intensity component with an image intensity component due to the light source and the first mask.

14. The non-transitory computer-readable storage medium of claim 13, wherein if the patterned layer is the topmost layer in the multilayer structure, generating the first virtual mask for the patterned layer involves:
  for each pattern in the patterned layer, converting a corresponding pattern in the patterned-layer mask into a corresponding clear area in the first virtual mask, wherein the corresponding clear area preserves some or all of the following properties of the corresponding pattern in the patterned-layer mask:
    a position of the corresponding pattern;
    a geometry of the corresponding pattern;
    a width of the corresponding pattern;
    a transmission coefficient of the corresponding pattern; and
    a phase of the corresponding pattern.

15. The non-transitory computer-readable storage medium of claim 13, wherein converting the corresponding pattern into the corresponding clear area involves biasing one or more of the following parameters of the corresponding pattern with a biasing factor to obtain the corresponding clear area:
  a position of the corresponding pattern;
  a geometry of the corresponding pattern;
  a width of the corresponding pattern;
  a transmission coefficient of the corresponding pattern; and
  a phase of the corresponding pattern.

16. The non-transitory computer-readable storage medium of claim 13, wherein if the patterned layer is not the topmost layer in the multilayer structure, generating the first virtual mask for the patterned layer involves:
  identifying overlapping regions between the patterned layer and each of the upper patterned layers in the multilayer structure which are above the patterned layer;
  for each pattern in the patterned layer,
    determining a corresponding reflector by subtracting the overlapping regions from the pattern; and
    if the corresponding reflector has a non-zero area, converting the corresponding reflector into a corresponding clear area in the first virtual mask;
    wherein the corresponding clear area preserves some or all of the following properties of the corresponding reflector:
      a position of the corresponding reflector;
      a geometry of the corresponding reflector;
      a width of the corresponding reflector;
      a transmission coefficient of the corresponding reflector; and
      a phase of the corresponding reflector.

17. The non-transitory computer-readable storage medium of claim 16, wherein identifying the overlapping regions between the patterned layer and each of the upper patterned layers involves:
  converting a corresponding mask for the upper patterned layer into a same mask tone as the corresponding mask for the patterned layer; and
  performing an AND operation between the converted mask for the upper patterned layer and the corresponding mask for the patterned layer.

18. The non-transitory computer-readable storage medium of claim 16, wherein converting the corresponding reflector into the corresponding clear area involves biasing one or more of the following parameters of the corresponding reflector with a biasing factor to obtain the corresponding clear area:
- a position of the corresponding reflector;
- a geometry of the corresponding reflector;
- a width of the corresponding reflector;
- a transmission coefficient of the corresponding reflector; and
- a phase of the corresponding reflector.

19. The non-transitory computer-readable storage medium of claim 13, wherein adjusting the process model involves adjusting an optical focus of the photolithography process based on the vertical position of the patterned layer.

20. The non-transitory computer-readable storage medium of claim 13, wherein adjusting the process model involves modifying the multilayer structure by planarizing the patterned layer.

21. The non-transitory computer-readable storage medium of claim 13, wherein the method further comprises obtaining the image intensity component by convolving, at the location in the PR layer, the process model with the first mask.

22. The non-transitory computer-readable storage medium of claim 13, wherein estimating the image intensity value involves combining a first vector field component due to the light source and the first mask and a second vector field component due to the light source and the first virtual mask.

23. A apparatus that determines image intensity at a location in a photoresist (PR) layer on a wafer, wherein a photolithography process uses a light source and a first mask to expose the PR layer, wherein the wafer includes a multilayer structure underneath the PR layer, and wherein the multilayer structure includes one or more patterned layers which were created by one or more previous applications of the photolithography process, the system comprising:

- a processor;
- a memory;
- a receiving mechanism configured to receive a set of masks which were used to generate the one or more patterned layers of the multilayer structure, wherein a patterned layer in the one or more patterned layers includes a set of reflectors on a top surface of the patterned layer, which correspond to patterns in a patterned-layer mask in the set of masks, wherein a reflector reflects light from the light source during the photolithography process;
- a generating mechanism configured to generate a first virtual mask based at least on the first mask and the patterned-layer mask, which involves:
  - receiving a process model which models the photolithography process;
  - adjusting the process model to take into account the position of the patterned layer;
- and convolving, at the location in the PR layer, the adjusted process model with the first virtual mask, wherein the first virtual mask uses a clear area to model a reflector in the set of reflectors of the patterned layer on the wafer; and
- a computing mechanism configured to compute the image intensity value at the location in the PR layer by:
  - computing a first image intensity component due to the light source and the first virtual mask; and
  - estimating the image intensity value by combining the first image intensity component with an image intensity component due to the light source and the first mask.

* * * * *